United States Patent
Cui et al.

(10) Patent No.: US 10,238,011 B1
(45) Date of Patent: Mar. 19, 2019

(54) OPTIMAL CONTROLLER FOR HYBRID LIQUID-AIR COOLING SYSTEM OF ELECTRONIC RACKS OF A DATA CENTER

(71) Applicant: Baidu USA LLC, Sunnyvale, CA (US)

(72) Inventors: Yan Cui, San Jose, CA (US); Tianyi Gao, Santa Clara, CA (US); Charles J. Ingalz, San Jose, CA (US); Ali Heydari, Albany, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 15/729,656

(22) Filed: Oct. 10, 2017

(51) Int. Cl.
*H05K 7/20* (2006.01)

(52) U.S. Cl.
CPC ..... *H05K 7/20836* (2013.01); *H05K 7/20736* (2013.01); *H05K 7/20781* (2013.01); *H05K 7/20172* (2013.01); *H05K 7/20254* (2013.01); *H05K 7/20272* (2013.01)

(58) Field of Classification Search
CPC ............. H05K 7/20836; H05K 7/2079; H05K 7/20745; H05K 7/20827; H05K 7/20763; H05K 7/20281; H05K 7/20772; H05K 7/20781; H05K 7/20272; H05K 7/20718; H05K 7/20754; H05K 7/20736; H05K 7/20172; H05K 7/20254; G06F 1/206; G06F 1/20
See application file for complete search history.

(56) References Cited

U.S. PATENT DOCUMENTS

| | | | |
|---|---|---|---|
| 9,476,657 B1* | 10/2016 | Pettis | H05K 7/208 |
| 2006/0161311 A1* | 7/2006 | Vinson | G05D 23/19 |
| | | | 700/300 |
| 2009/0267404 A1* | 10/2009 | Thompkins | B60B 11/10 |
| | | | 301/38.1 |
| 2013/0138253 A1* | 5/2013 | Chainer | G05D 7/0635 |
| | | | 700/282 |
| 2014/0060773 A1* | 3/2014 | Wajima | G06F 1/20 |
| | | | 165/11.1 |
| 2014/0163764 A1* | 6/2014 | Campbell | H05K 7/2079 |
| | | | 700/300 |
| 2014/0190681 A1* | 7/2014 | Chainer | H05K 7/20836 |
| | | | 165/289 |

(Continued)

*Primary Examiner* — Adam B Dravininkas
(74) *Attorney, Agent, or Firm* — Womble Bond Dickinson (US) LLP

(57) ABSTRACT

An optimal controller is utilized minimize a total energy consumption of a CDU and cooling fans by optimizing a liquid pump speed of the CDU and fan speeds of the cooling fans collectively, while satisfying a set of constraints associated with liquid pump and the cooling fans. The total energy consumption includes a liquid pump energy cost and a fan energy cost. The optimal controller is to control the pump speed and fan speed at the same time to minimize the total energy cost, while keeping the processor's temperature below a predetermined reference temperature using an optimization function or model. The optimization model includes both the liquid and air cooling dynamics and converted the dynamics to a convex optimization problem. The optimization is performed to determine a set of pump speed and fan speeds such that the objective function reaches minimum, while the constraints are satisfied.

21 Claims, 10 Drawing Sheets

(56) References Cited

U.S. PATENT DOCUMENTS

| | | | |
|---|---|---|---|
| 2014/0202678 A1* | 7/2014 | Goth | H05K 7/20772 165/287 |
| 2015/0057810 A1* | 2/2015 | Smith | F24F 11/001 700/276 |
| 2017/0181326 A1* | 6/2017 | Shelnutt | G05D 7/0629 |
| 2017/0285699 A1* | 10/2017 | Ahuja | G06F 1/3203 |

* cited by examiner

FIG. 6

| Name | Function | Use/Operation |
|---|---|---|
| $P_{fan}$ | fan power | A function of individual fan speeds, and is calculated at RMC. |
| $P_{pump}$ | pump power | A function of pump speed, and is calculated at RMC. |
| $Q_{g \to air}$ | processor heat removed by air | Calculated by $(1-\alpha)Q_{processor,i}$, raw data read from BMC, calculated at RMC. |
| $Q_{g \to liquid}$ | processor heat removed by liquid | Calculated by $\alpha Q_{processor,i}$, raw data read from BMC, calculated at RMC. |
| $R_{g \to air}$ | heat resistance, processor to air | Constant, pre-calibrated by experiment. |
| $R_{g \to liquid}$ | heat resistance, processor to liquid | Constant, pre-calibrated by experiment. |
| $T_{air}$ | air inlet temperature | Rack air inlet temperature, can be read from BMC and transferred to RMC for calculation. |
| $T_{liquid}$ | liquid inlet temperature | Rack liquid supply temperature, can be read from CDU and transferred to RMC for calculation. |
| $T_{processor,i}$ | ith processor chip temperature | Read from BMC and transferred to RMC. |
| $T_{ref}$ | processor chip reference temperature | Constant, pre-loaded at BMC and RMC. |
| $v_{fan,i}$ | ith fan speed | Variable to control, can be read/write through fan module and communication with RMC. |
| $\underline{v}_{fan}$ | fan speed, lower bound | Constant, pre-loaded at fan module and RMC. |
| $\overline{v}_{fan}$ | fan speed, upper bound | Constant, pre-loaded at fan module and RMC. |
| $v_{pump}$ | pump speed | Variable to control, can be read/write through CDU and communication with RMC. |
| $\underline{v}_{pump}$ | pump speed, lower bound | Constant, pre-loaded at CDU and RMC. |
| $\overline{v}_{pump}$ | pump speed, upper bound | Constant, pre-loaded at CDU and RMC. |

$$\left\{\begin{array}{l}\alpha Q_{processor,i}\dfrac{C_1}{v_{pump}}+T_{liquid}=T_{processor,i}\leq T_{ref}\\(1-\alpha)Q_{processor,i}\dfrac{C_2}{v_{fan,i}}+T_{air}=T_{processor,i}\leq T_{ref}\end{array}\right\}\Rightarrow\left\{\begin{array}{l}\alpha Q_{processor,i}\cdot C_1\cdot v_{pump}^{-1}+(T_{liquid}-T_{ref})\leq 0\\(1-\alpha)Q_{processor,i}\cdot C_2\cdot v_{fan,i}^{-1}+(T_{air}-T_{ref})\leq 0\end{array}\right.$$

FIG. 7

$$\vec{g}(\vec{x}) = \begin{pmatrix} g_1(\vec{x}) \\ g_2(\vec{x}) \\ g_3(\vec{x}) \\ g_4(\vec{x}) \\ g_5(\vec{x}) \\ g_6(\vec{x}) \\ \vdots \\ \vdots \\ \vdots \\ g_{3n+1}(\vec{x}) \\ g_{3n+2}(\vec{x}) \\ g_{3n+3}(\vec{x}) \end{pmatrix} = \begin{pmatrix} \alpha Q_{processor,i} C_1 \cdot v_{pump}^{-1} + (T_{liquid} - T_{ref}) \\ \underline{v}_{pump} - v_{pump} \\ v_{pump} - \overline{v}_{pump} \\ (1-\alpha) Q_{processor,1} C_2 \cdot v_{fan,1}^{-1} + (T_{air} - T_{ref}) \\ \underline{v}_{fan} - v_{fan,1} \\ v_{fan,1} - \overline{v}_{fan} \\ \vdots \\ \vdots \\ \vdots \\ (1-\alpha) Q_{processor,n} C_2 \cdot v_{fan,n}^{-1} + (T_{air} - T_{ref}) \\ \underline{v}_{fan} - v_{fan,n} \\ v_{fan,n} - \overline{v}_{fan} \end{pmatrix} \leq \vec{0}^T$$

FIG. 8

OPTIMAL CONTROLLER FOR HYBRID LIQUID-AIR COOLING SYSTEM OF ELECTRONIC RACKS OF A DATA CENTER

FIELD OF THE INVENTION

Embodiments of the present invention relate generally to data centers. More particularly, embodiments of the invention relate to an optimal controller for a hybrid liquid-air cooling system for electronic racks in data centers.

BACKGROUND

Heat removal is a prominent factor in a computer system and data center design. The number of high performance electronics components such as high performance processors packaged inside servers has steadily increased, thereby increasing the amount of heat generated and dissipated during the ordinary operation of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient heat removal solutions especially in the cases of cooling these high performance servers.

Power intensive processors enable the solution of intensive computing such as deep learning. Electrical servers having those processors, i.e., high-power central processing units (CPUs) and/or general-purpose processing units (GPUs), have a very high power density per volumetric space, and hence, traditional simple air cooling is very challenging. Direct-to-chip liquid cooling provides a better cooling performance for those power-intensive processors, and saves energy consumption compared to an air-cooling only approach. Practically, not all the heat generated by the processors is removed through liquid cooling, and there is still some percentage of heat is removed by air cooling. Thus the entire environment is a hybrid liquid-air cooling system. In a hybrid liquid-air cooling system, a liquid flow rate is controlled via pump speed control in a coolant distribution unit (CDU), and an airflow rate is controlled via fan speed control on the back of an electronic rack. Conventional cooling systems have not been efficient enough to reduce energy consumption of the cooling systems.

BRIEF DESCRIPTION OF THE DRAWINGS

Embodiments of the invention are illustrated by way of example and not limitation in the figures of the accompanying drawings in which like references indicate similar elements.

FIG. 6 shows a data structure containing variables utilized for speed optimization according to one embodiment.

FIG. 7 shows an algorithm of a speed optimization according to one embodiment.

FIG. 8 shows a set of constraints utilized for speed optimization according to one embodiment.

DETAILED DESCRIPTION

Figure 1:
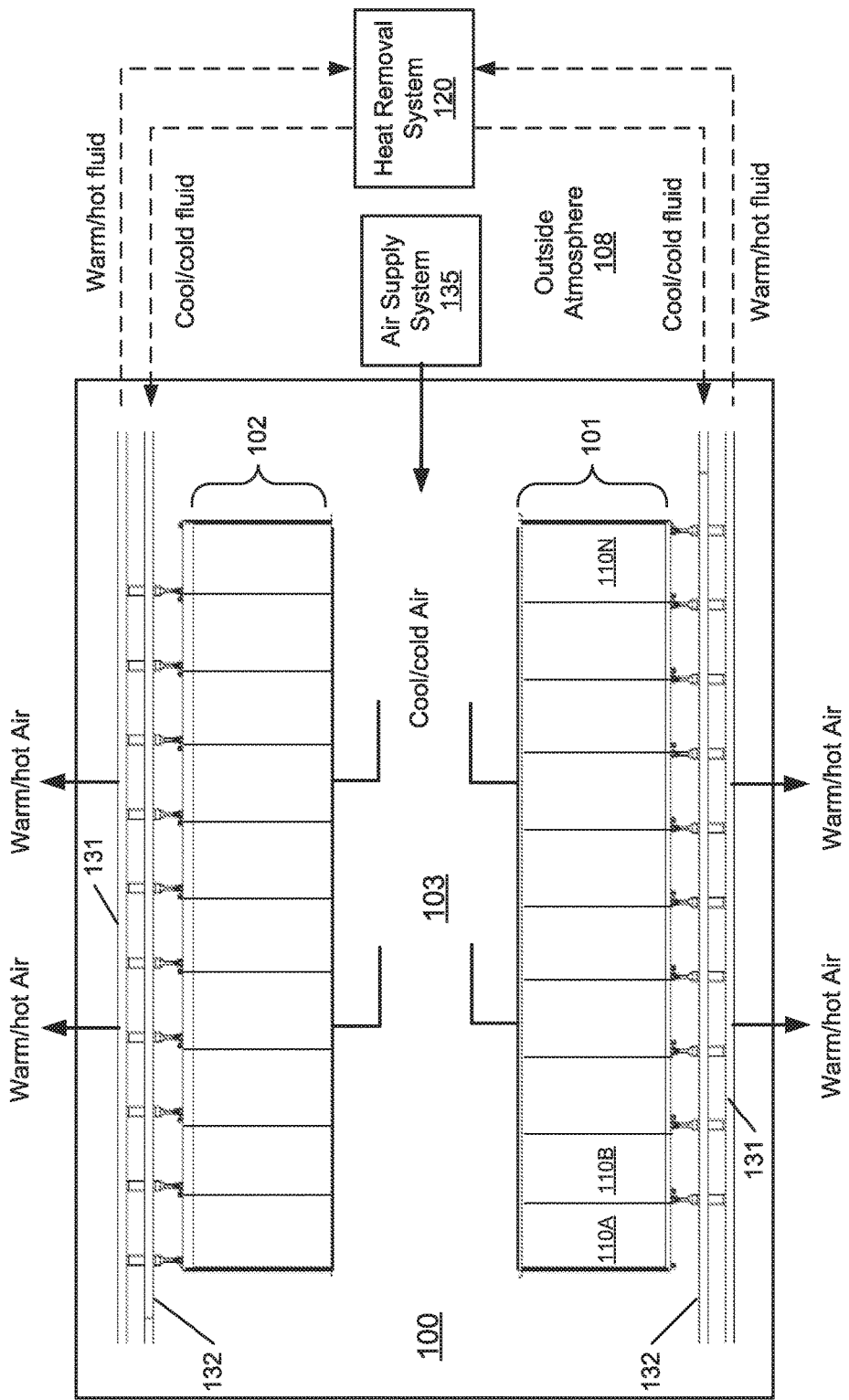
FIG. 1 is a block diagram illustrating an example of a data center facility according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Accordingly, an optimal controller is utilized to minimize a total energy consumption of a CDU and cooling fans by optimizing a liquid pump speed of the CDU and fan speeds of the cooling fans collectively, while satisfying a set of constraints associated with liquid pump and the cooling fans. The total energy consumption includes a liquid pump energy cost and a fan energy cost. The processor's temperature is affected by both a liquid flow rate of a liquid cooling system and an airflow rate of an air cooling system. Due to different properties of the liquid-cooling and air-cooling dynamics, an optimal controller is critical to control the pump speed and fan speed at the same time to minimize the total energy cost, while keeping the processor's temperature below a predetermined reference temperature. The optimal controller utilizes new lumped modeling of a hybrid liquid-air cooling system. The optimization model includes both the liquid and air cooling dynamics converted the dynamics to a convex optimization problem. An objective function represents the total energy consumption, and constraints include processor's reference temperature, maximum and minimum pump and fan speeds. The optimization is performed to determine a set of optimal pump speed and optimal fan speeds such that the objective function reaches minimum, while the constraints are satisfied.

According to one embodiment, an electronic rack usable in a data center includes a stack of computing nodes, a number of cooling fans to provide air cooling to the computing nodes, a CDU to provide liquid cooling to the computing nodes, and a rack management controller (RMC) coupled to the computing nodes, the CDU, and the cooling fans. Each computing node may representing a server having at least one processor attached to a cold plate. One or more of the cooling fans correspond to one of the computing nodes, for example, by mounting on the backend of the computing node. The cooling fans are configured to provide air cooling to the computing nodes. The CDU is configured to provide liquid cooling to one or more processors of each computing node via a corresponding cold plate attached to each processor. The CDU includes a liquid pump configured to provide cooling liquid to each cold plate to remove the heat generated from the associated processor of each computing node.

In one embodiment, the RMC is configured to collect real-time operating data from the computing nodes, the cooling fans, and the CDU. The RMC performs an optimization using a predetermined optimization function or cost function to determine an optimal pump speed of the liquid pump of the CDU and optimal fan speeds of the cooling fans based on the real-time operating data, such that an output of the optimization function representing a total power consumption of the liquid pump and cooling fans reaches minimum. The RMC then controls the pump speed of the liquid pump using the optimal pump and controls the fan speeds of the cooling fans using the optimal fan speeds.

In one embodiment, the pump speed and the fan speeds are optimized collaboratively and concurrently using the optimization function, where the pump speed and the fan speeds are a part of coefficients of the optimization function. The optimization of the pump speed and the fan speeds is performed in view of a set of constraints, such that the optimization function reaches minimum while the set of constraints are satisfied. The set of constraints include ranges of operating parameters within which the liquid pump or a cooling fan are designed to operate, which may be determined based on the respective design specification of the liquid pump and cooling fans.

In one embodiment, the optimization is performed such that a total power consumption of the liquid pump and all of the cooling fans reaches minimum, while the pump speed is within a lower pump speed limit and an upper pump limit; the fan speed of each cooling fan is within its respective lower fan speed limit and upper fan speed limit concurrently; and the temperature of each processor is lower than the corresponding processor reference temperature. The fan speed limits may be identical or different for different cooling fans. Similarly, processor reference temperatures for different processors may be the same or different.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied.

In one embodiment, each of the electronic racks (e.g., electronic racks 110A-110N) includes a housing to house a number of electronic racks of IT components operating therein. The electronic racks can include a heat removal liquid manifold, a number of server slots, and a number of server blades capable of being inserted into and removed from the server slots. Each server blade represents a computing node having one or more processors, a memory, and/or a persistent storage device (e.g., hard disk). At least one of the processors is attached to a liquid cold plate to receive liquid cooling. In addition, one or more cooling fans are associated with the server blades to provide air cooling to the computing nodes contained therein. Note that the heat removal system 120 may be coupled to multiple data center systems such as data center system 400.

In one embodiment, heat removal system 120 includes an external liquid loop connected to a cooling tower or a dry cooler external to the building/housing container. The heat removal system 120 can include, but is not limited to evaporative cooling, free air, rejection to large thermal mass, and waste heat recovery designs.

In one embodiment, each server blade is coupled to the heat removal liquid manifold modularly such that a server blade can be removed from the electronic rack without affecting the operations of remaining server blades on the electronic rack and the heat removal liquid manifold. In another embodiment, each server blade is coupled to the heat removal liquid manifold (also referred to as a cooling liquid manifold) through a quick-release coupling assembly having a first liquid intake connector and a first liquid outlet connector coupled to a flexible hose to distribute the heat removal liquid to the processors. The first liquid intake connector is to receive heat removal liquid via a second liquid intake connector from a heat removal liquid manifold mounted on a backend of the electronic rack. The first liquid outlet liquid connector is to emit warmer or hotter liquid carrying the heat exchanged from the processors to the heat removal liquid manifold via a second liquid outlet connector and then back to a CDU within the electronic rack.

In one embodiment, the heat removal liquid manifold disposed on the backend of each electronic rack is coupled to liquid supply line 132 to receive heat removal liquid (also referred to as cooling liquid) from heat removal system 120. The heat removal liquid is distributed through a liquid distribution loop attached to a cold plate on which a processor is mounted to remove heat from the processors. A cold plate is configured similar to a heat sink with a liquid distribution tube attached or embedded therein. The resulting warmer or hotter liquid carrying the heat exchanged from the processors is transmitted via supply line 131 back to heat removal system 120. Liquid supply lines 131-132 are referred to as data center liquid supply lines (e.g., global liquid supply lines), which supply heat removal liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server blades in the electronic rack to deliver the cooling liquid to the cold plates of the processors.

In one embodiment, data center system 100 further includes an airflow delivery system 135 to generate an airflow to cause the airflow to travel through the air space of the server blades of the electronic racks to exchange heat generated by the computing nodes due to operations of the computing nodes (e.g., servers) and to exhaust the airflow exchanged heat to an external environment 108 outside of housing/room/building. For example, air supply system 135 generates an airflow of cool/cold air to circulate from aisle 103 through electronic racks 110A-110N to carry away exchanged heat. The cool airflows enter the electronic racks through their frontends and the warm/hot airflows exit the electronic racks from their backends. The warm/hot air with exchanged heat is exhausted from room/building. Thus, the cooling system is a hybrid liquid-air cooling system, where a portion of the heat generated by a processor is removed by cooling liquid via the corresponding cold plate, while the remaining portion of the heat generated by the processor is removed by airflow cooling.

According to one embodiment, each of the electronic racks includes an RMC coupled to the CDU and each of the computing nodes of the electronic rack (not shown). The RMC periodically or constantly monitors operating status of the CDU, computing nodes, and cooling fans. The operating data of the operating status may include the operating temperatures of each processor, cooling liquid, and an airflow, etc. measured at real time. Based on the operating data received from various components, the RMC performs an optimization using an optimization function to determine the optimal pump speed of a liquid pump of the CDU and optimal fan speeds of the cooling fans, such that the power consumption of the liquid pump and the cooling fans reaches minimum, while the liquid pump and the cooling fans are operating properly according to their respective specifications (e.g., the speeds of the liquid pump and cooling fans are within their respective predefined ranges).

That is, the optimization is performed at a global level by optimizing all components involved simultaneously, such that 1) the temperatures of the processors are below their respective reference temperatures, 2) the total power consumption by the liquid pump and the cooling fans reaches minimum, and 3) each of the liquid pump and cooling fans operates within their respective specification. The optimal pump speed and the optimal fan speeds are then utilized to configure the liquid pump and the cooling fans. As a result, the total power consumption by the liquid pump and the cooling fans reaches minimum while the processors of the computing nodes operate properly.

Figure 2:
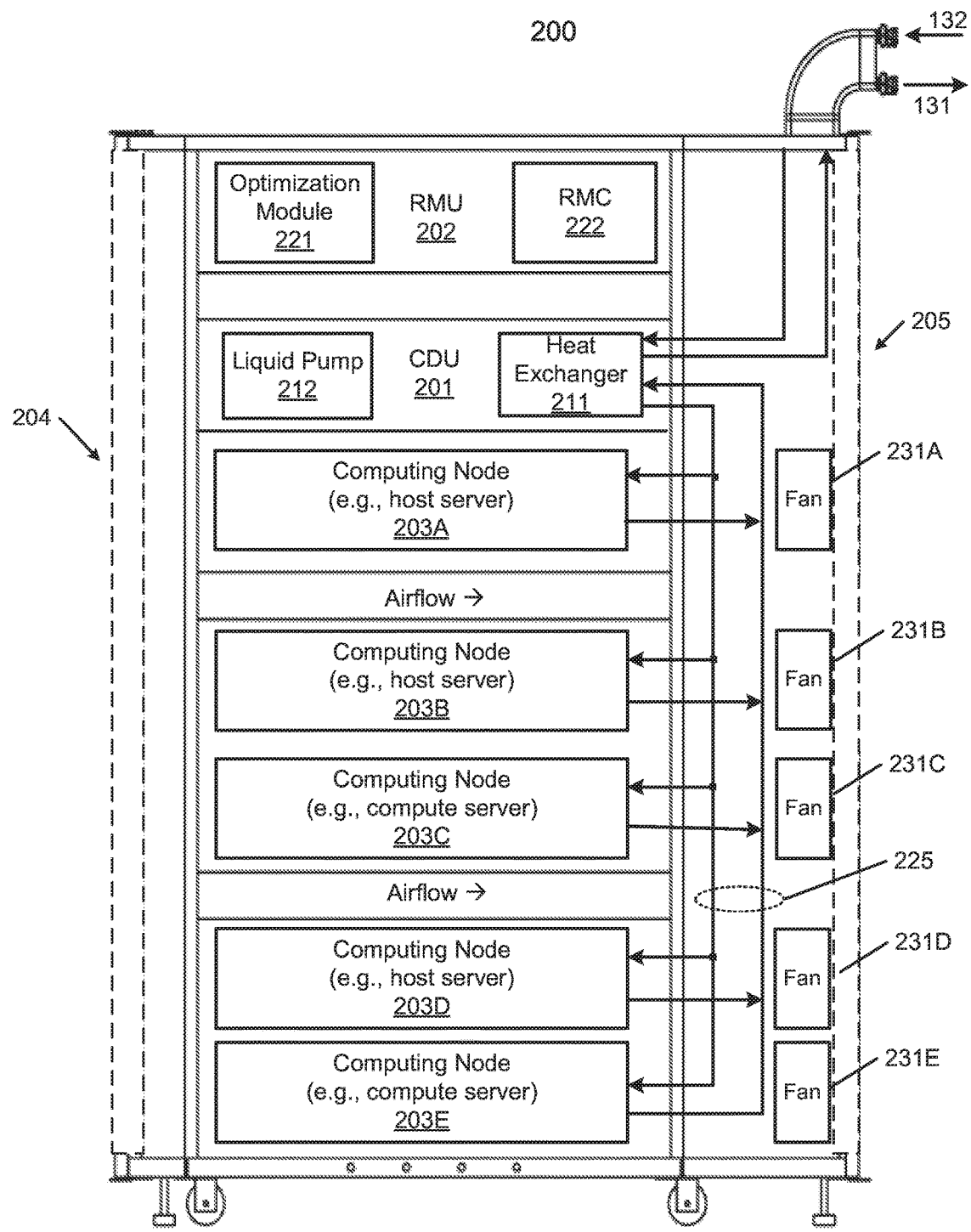
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, rack management unit (RMU) 202, and one or more server blades 203A-203E (collectively referred to as server blades 203). Server blades 203 can be inserted into an array of server slots respectively from frontend 204 or backend 205 of electronic rack 200. Note that although there are only five server blades 203A-203E shown here, more or fewer server blades may be maintained within electronic rack 200. Also note that the particular positions of CDU 201, RMU 702, and server blades 203 are shown for the purpose of illustration only; other arrangements or configurations of CDU 201, RMU 702, and server blades 203 may also be implemented. Note that electronic rack 200 can be either open to the environment or partially contained by a rack container, as long as the cooling fans can generate airflows from the frontend to the backend.

In addition, for each of the server blades 203, a fan module is associated with the server blade. In this embodiment, fan modules 231A-231E, collectively referred to as fan modules 231, are associated with server blades 203A-203E respectively. Each of the fan modules 231 includes one or more cooling fans. Fan modules 231 may be mounted on the backends of server blades 203 to generate airflows flowing from frontend 204, traveling through the air space of the sever blades 203, and existing at backend 205 of electronic rack 200.

In one embodiment, CDU 701 mainly includes heat exchanger 711, liquid pump 712, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132 are coupled to a set of room manifolds, which are coupled to heat removal system 120 as described above. In addition, heat exchanger 211 further includes a second loop with two ports having a second pair of liquid connectors coupled to liquid manifold 225 to form a secondary loop, which may include a supply manifold to supply cooling liquid to server blades 203 and a return manifold to return warmer liquid back to CDU 201. Note that CDUs 201 can be any kind of CDUs commercially available or customized ones. Thus, the details of CDUs 201 will not be described herein.

Each of server blades 203 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 200 further includes RMU 202 configured to provide and manage power supplied to servers 203, fan modules 231, and CDU 101. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and fan modules 231. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules 231 and liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive a set of optimal fan speeds for fan modules 231 and an optimal pump speed for liquid pump 212, such that the total power consumption of liquid pump 212 and fan modules 231 reaches minimum, while the operating data associated with liquid pump 212 and cooling fans of fan modules 231 are within their respective designed specifications. Once the optimal pump speed and optimal fan speeds have been determined, RMC 222 configures liquid pump 212 and cooling fans of fan modules 231 based on the optimal pump speed and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server blades 203. Similarly, based on the optimal fan speeds, RMC 222 communicates with each of the fan modules 231 to control the speed of each cooling fan of the fan modules 231, which in turn control the airflow rates of the fan modules 231. Note that each of fan modules 231 may be individually controlled with its specific optimal fan speed, and different fan modules and/or different cooling fans within the same fan module may have different optimal fan speeds.

Figure 3:
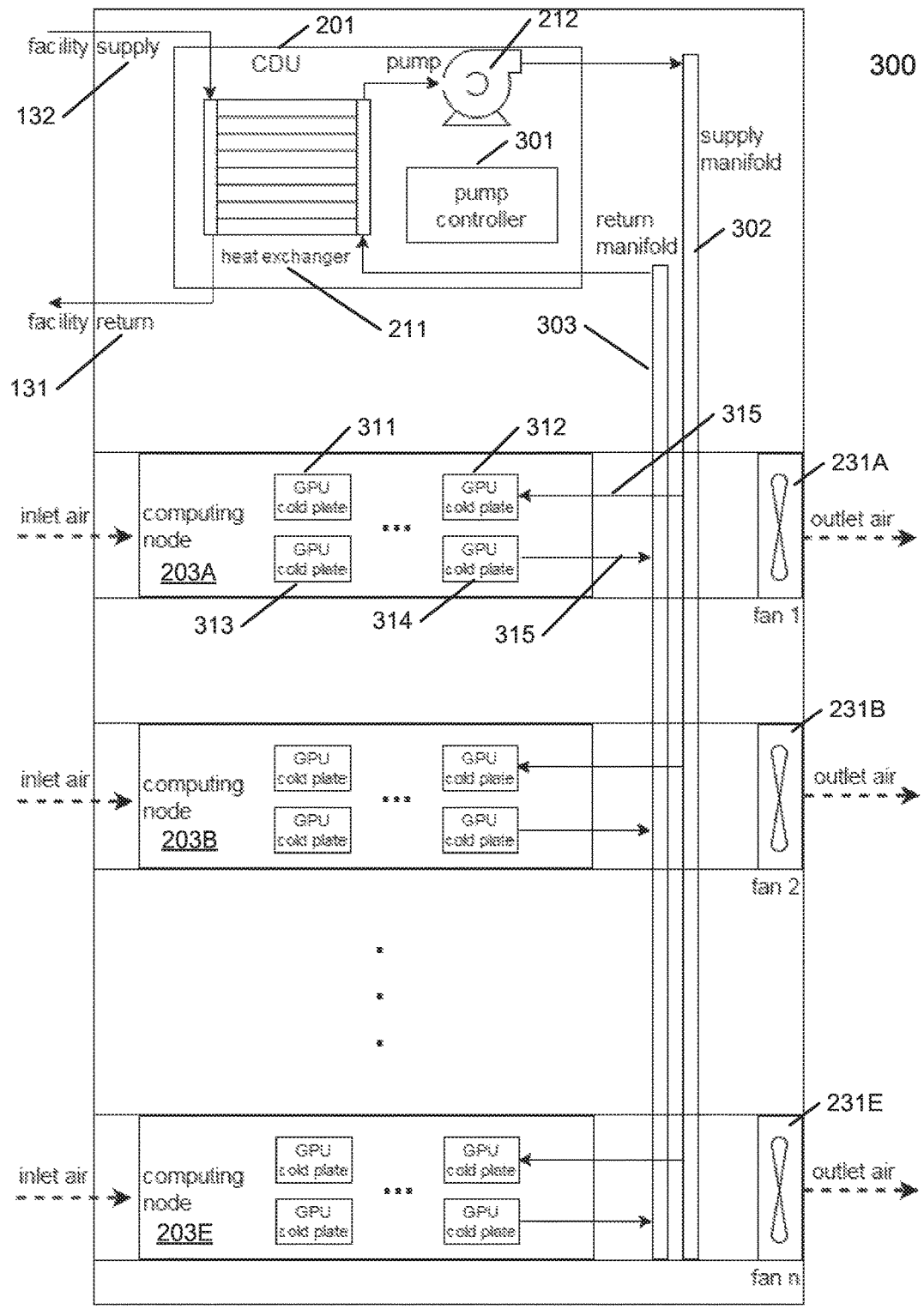
FIG. 3 is a block diagram illustrating an example of an electronic rack according to another embodiment.

FIG. 3 is a block diagram illustrating an electronic rack according to another embodiment. Electronic rack 300 may be implemented as a part of electronic rack 200 of FIG. 2. Referring to FIG. 3, in this example, CDU 201 includes pump controller 301 to control the speed of liquid pump 212, where liquid pump 212 is configured to control the liquid flow rate of liquid supply manifold 302 and return manifold 303. Each of the computing nodes 203A-203E contains one or more processors (e.g., general-purpose processing units or GPUs). At least one of the processors is mounted on a cold plate. The liquid supply manifold 302 and liquid return manifold 303 are coupled to each of the cold plates via a liquid distribution loop. For example, the cooling liquid is supplied via liquid supply manifold 302, goes through each of processor cold plates 311-314 of computing node 203A, and then exits back to liquid return manifold 303 and back to heat exchanger 211 of CDU 201. Meanwhile each of fan modules 231 is mounted on the backend of each of computing nodes 203 to provide air cooling to the processors concurrently.

Figure 4:
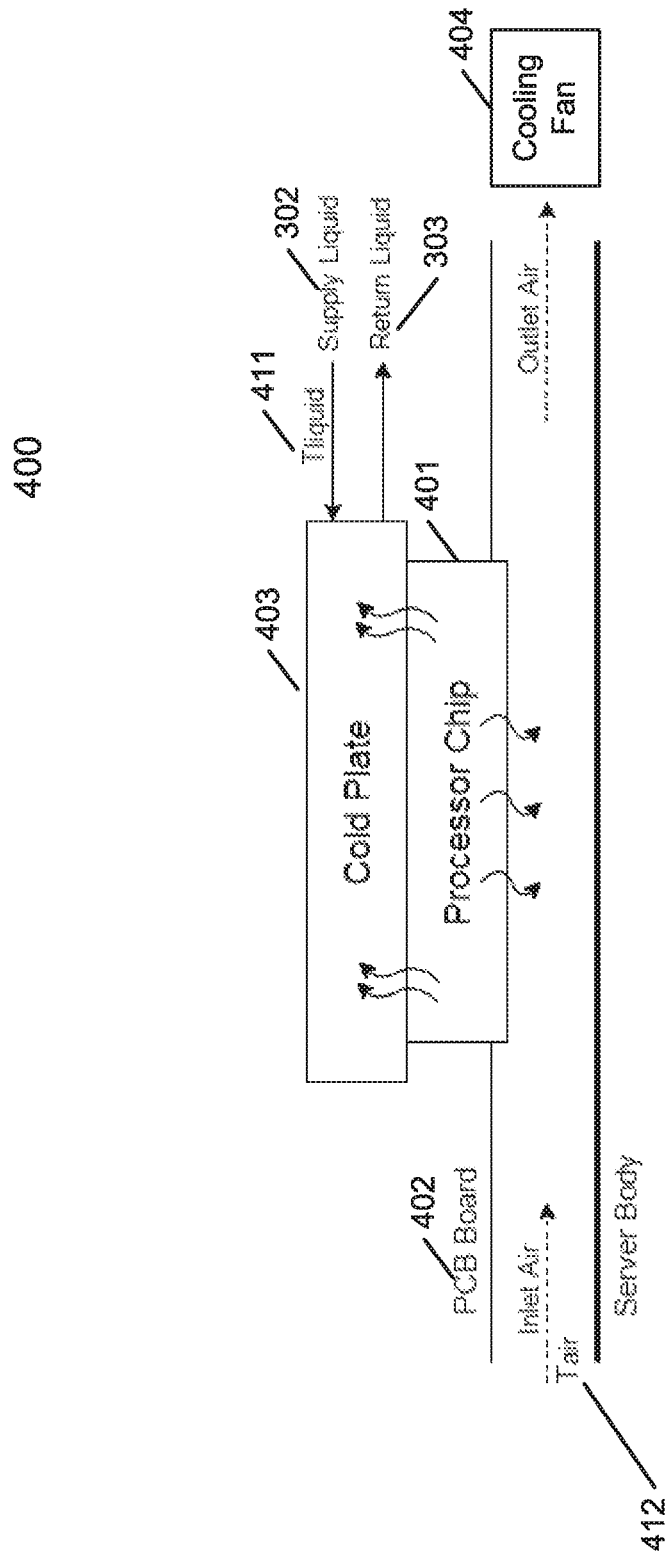
FIG. 4 is a block diagram illustrating a cold plate associated with a processor that can be used in a computing node according to one embodiment.

FIG. 4 is a block diagram illustrating a processor cold plate configuration according to one embodiment. The processor/cold plate structure 400 can represent any of the processors/cold plate structures such as processor cold plates 311-314 as shown in FIG. 3. Referring to FIG. 4, processor 401 is soldered on printed circuit board (PCB) 402 coupled to other electrical components or circuits. Processor 401 is also attached to cold plate 403, which is coupled to liquid supply line 302 and liquid return line 303. A portion of the heat generated by processor 401 is removed by the cooling liquid. The remaining portion of the heat enters into air space 405, which may be removed by an airflow generated by cooling fan 404.

Figure 5:
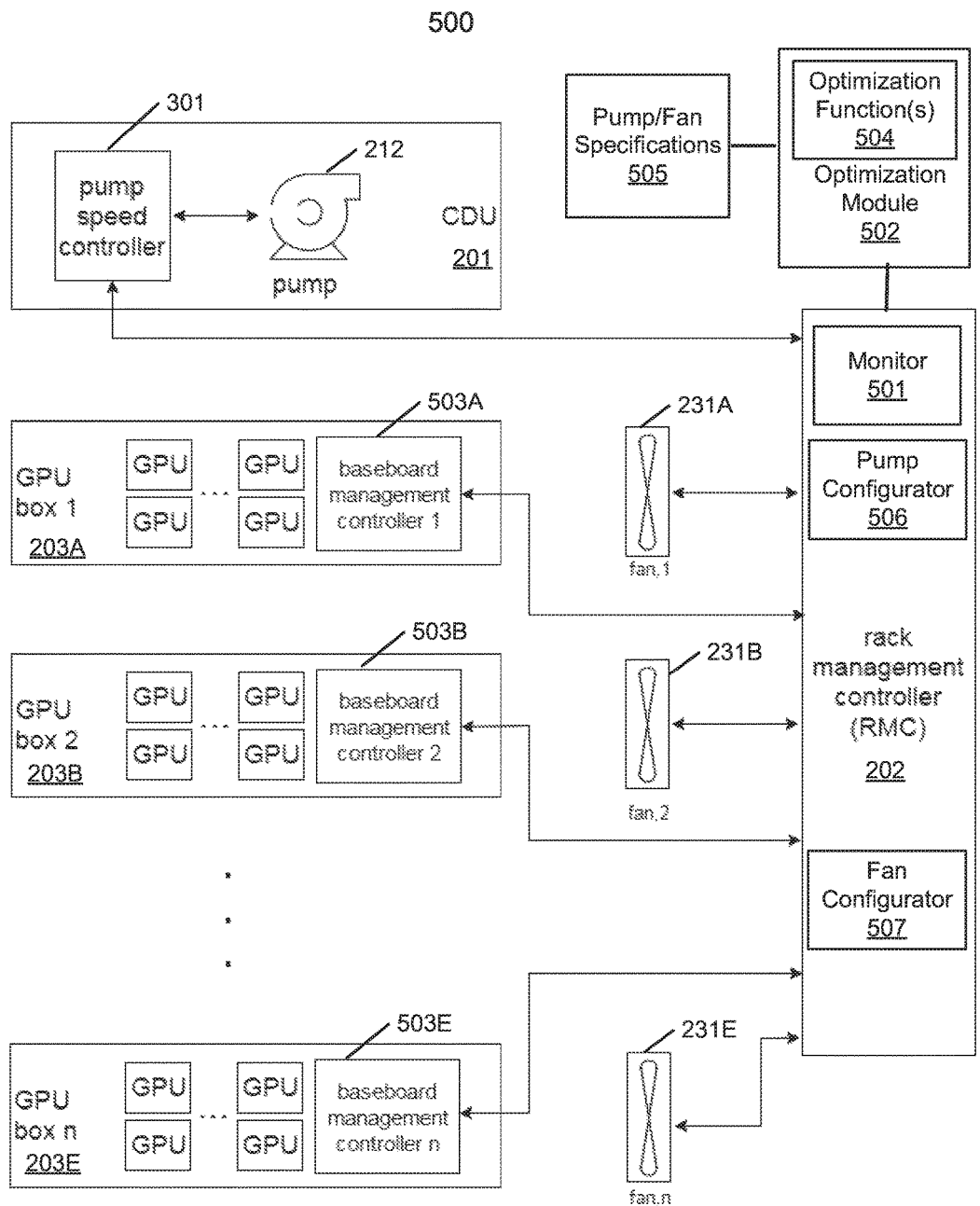
FIG. 5 is a block diagram illustrating an example of an electronic rack according to another embodiment.

FIG. 5 is a block diagram illustrating an example of a rack management controller according to one embodiment. Referring to FIG. 5, RMC 202 includes a monitor 501 to monitor operating status of various components, such as, for example, CDU 201, computing nodes 203, and fan modules 231. In one embodiment, monitor 501 communicates with a baseboard management controller (BMC) of each of computing nodes 203 such as BMCs 503A-503E, collectively referred to as EMCs 503. BMCs 503 may include logic that can be implemented in software, hardware, or a combination of both.

A BMC of each computing node refers to a local controller implemented on the motherboard of the computing node to manage the components onboard, including reading operating data from the components and sends signals or commands to the components to control the operations of the components. In one embodiment, a BMC may measure the voltage and electrical current consumed by a processor, which may be utilized to derive the power (e.g., power=volts*current) generated by the processor. The power generated by the processor is proportional to the heat generated by the processor. A BMC may also communicate with a temperature sensor to measure a temperature of a processor, a temperature of the cooling liquid (e.g., liquid temperature 411 of FIG. 4), and/or a temperature of an airflow (e.g., airflow temperature 412 of FIG. 4).

In addition, monitor 501 communicates with pump controller 301 to obtain pump operating data of CDU. Pump controller 301 is configured to control the operations of liquid pump 212 such as the speed of liquid pump 212, which in turn controls a liquid flow rate of cooling liquid supplied to the cold plates of the processors of computing nodes 203. In one embodiment, pump controller 301 is configured to measure the pump speed of liquid pump 212, which in turn is provided to monitor 501. In addition, monitor 501 may be coupled to a temperature sensor within or near CDU 201 to measure a liquid temperature of the cooling liquid provided by liquid pump 212. Similarly, according to one embodiment, monitor is communicatively coupled to each of the fan modules 231 to obtain fan operating data of the cooling fans contained therein, such as, for example, the fan speeds of the cooling fans and airflow temperatures of the airflows generated by the cooling fans.

According to one embodiment, based on the operating data collected from BMCs 503, CDU 201, and fan modules 231, optimization module 502 is configured to perform an optimization on the pump speed of liquid pump 212 and fan speeds of cooling fans of fan modules 231 using one or more optimization functions or models 504 in view of a set of constraints related to the pump/fan specifications 505. The optimization is performed to determine a set of optimal pump speed for liquid pump 212 and optimal fan speeds for fan modules 231, such that the total power consumption of liquid pump 212 and cooling fans of fan modules 231 reaches minimum, while the operating data of the components involved satisfies the set of predefined constraints. The optimal pump speed and the optimal fans speeds are then utilized by pump configurator 506 and fan configurator 507 to configure the speeds of liquid pump 212 and the cooling fans of fan modules 231 respectively.

In one embodiment, the pump speed of liquid pump 212 and the fan speeds of cooling fans of fan modules 231 are optimized collaboratively and concurrently using the optimization functions 504, where the pump speed and the fan speeds are a part of coefficients of the optimization functions. The optimization of the pump speed and the fan speeds is performed in view of a set of predefined constraints, such that the optimization function reaches minimum while the set of constraints are satisfied. The set of constraints include ranges of operating parameters within which the liquid pump or a cooling fan should operate, which may be obtained from the respective design specification 505 of the liquid pump and cooling fans.

In one embodiment, the optimization is performed such that a total power consumption of the liquid pump 212 and all of the cooling fans of fan modules 231 reaches minimum, while the pump speed is within the lower pump speed limit and the upper pump limit; the fan speed of each cooling fan is within its respective lower fan speed limit and upper fan speed limit concurrently; and the temperature of each processor is lower than the corresponding processor reference temperature associated with that particular processor.

Note that monitor 501 may be integrated with pump configurator 506 and fan configurator 507 to monitor the operation of liquid pump 212 and fan modules 231 respectively. In addition, pump configurator 506 and fan configurator 507 may be integrated as an integrated module. Furthermore, optimization module 502 may also be integrated with RMC 202 as an integrated controller. Optimization module 502 may be implemented as software, hardware, or a combination of both. For example, optimization 502 may include a machine-readable medium containing executable instructions to perform operations according to a set of one or more optimization algorithms such as optimization functions 504. Such algorithms may be executed by processing logic associated with optimization module 502 to carry out the optimization operations. Other configurations may also be applied herein.

As described above, an optimization function, also referred to as an objective function, can be configured based on a total power consumption of liquid pump 212 and each of the cooling fans associated with fan modules 231, where each of fan modules 231 may include one or more cooling fans. In one embodiment, the optimization function is configured as follows:

$$\sum P = \sum_i P_{fan,i} + \sum P_{pump}$$

where P refers to the total power, $P_{fan,i}$ refers to the power consumed by fan(i) (also referred to a fan speed optimization function for fan(i)), and $P_{pump}$ refers to the power consumed by the liquid pump (also referred to as a pump speed optimization function). Fan(i) is one of the cooling fans of fan modules 231. In one embodiment, different cooling fans of different ones of fan modules 231 or different cooling fans within the same fan module may be configured with the same or different fan speeds.

According to one embodiment, fan speed optimization function $P_{fan,i}$ and pump optimization function $P_{pump}$ are defined as follows:

$$P_{fan,i} = a_0 v_{fan,i}^3 + a_1 v_{fan,i}^2 + a_2 v_{fan,i} = f_1(v_{fan,i})$$

$$P_{pump} = b_0 v_{pump}^3 + b_1 v_{pump}^2 + b_2 v_{pump} = f_2(v_{pump})$$

where $v_{fan,i}$ refers to the speed of fan(i) and $v_{pump}$ refers to the speed of the liquid pump to be optimized. In this embodiment, the fan speed and pump speed optimization functions are implemented as a third degree polynomial functions, where $a_0$, $a_1$, $a_2$, $b_0$, $b_1$, and $b_2$ are predetermined coefficients. Other configurations may be implemented.

In one embodiment, a set of constraints are developed to meet the requirements of temperature, fan speed working range, and pump speed working ranges. For example, the constraints are defined as follows:

$$\begin{cases} T_{processor,i} \leq T_{ref} \\ \underline{v}_{fan} \leq v_{fan,i} \leq \overline{v}_{fan} \\ \underline{v}_{pump} \leq v_{pump} \leq \overline{v}_{pump} \end{cases}$$

In this example, the constraints specify that a processor temperature should be less than a processor reference temperature specified by the specification of the processor. A fan speed of a particular cooling fan should be within a lower fan speed limit and an upper fan speed limit specified by the fan specification of that particular cooling fan. Note that different cooling fans may have the same or different fan speed limits. The pump speed of the liquid pump should be within a lower pump speed limit and an upper pump speed limit specified by the pump specification of the liquid pump. For the purpose of illustration, certain variables or nomenclatures utilized throughout this application are defined in the following tables, also shown in FIG. 6.

| Name | Definition | Use/Operation |
|---|---|---|
| $P_{fan}$ | fan power | A function of individual fan speeds, and is calculated at RMC. |
| $P_{pump}$ | pump power | A function of pump speed, and is calculated at RMC. |
| $Q_{p\text{-}air}$ | processor heat removed by air | Calculated by $(1 - \alpha)Q_{processor,i}$, raw data read from BMC, calculated at RMC. |
| $Q_{p\text{-}liquid}$ | processor heat removed by liquid | Calculated by $\alpha Q_{processor,i}$, raw data read from BMC, calculated at RMC. |
| $R_{p\text{-}air}$ | heat resistance, processor to air | Constant, pre-calibrated by experiment. |
| $R_{p\text{-}air}$ | heat resistance, processor to liquid | Constant, pre-calibrated by experiment. |
| $T_{air}$ | air inlet temperature | Rack air inlet temperature, can be read from BMC and transferred to RMC for calculation. |
| $T_{liquid}$ | liquid inlet temperature | Rack liquid supply temperature, can be read from CDU and transferred to RMC for calculation. |
| $T_{processor,i}$ | $i^{th}$ processor chip temperature | Read from BMC and transferred to RMC. |
| $T_{ref}$ | processor chip reference temperature | Constant, pre-loaded at BMC and RMC. |
| $v_{fan,i}$ | $i^{th}$ fan speed | Variable to control, can be read/write through fan module and communication with RMC. |
| $\underline{v}_{fan}$ | fan speed, lower bound | Constant, pre-loaded at fan module and RMC. |
| $\overline{v}_{fan}$ | fan speed, upper bound | Constant, pre-loaded at fan module and RMC. |
| $v_{pump}$ | pump speed | Variable to control, can be read/write through CDU and communication with RMC. |
| $\underline{v}_{pump}$ | pump speed, lower bound | Constant, pre-loaded at CDU and RMC. |
| $\overline{v}_{pump}$ | pump speed, upper bound | Constant, pre-loaded at CDU and RMC. |

In the embodiment above, fan speeds and pump speed constraints are defined as straight forward. The processor temperature's constraint is converted to a function of fan and pump speed with additional physical dynamics. Referring back to FIG. 4, according to one embodiment, a processor's temperature of a particular processor, can be defined as follows:

$$\begin{cases} \dfrac{T_{processor,i} - T_{liquid}}{R_{p-liquid}} = Q_{p-liquid,i} = \alpha Q_{processor,i} \\ \dfrac{T_{processor,i} - T_{air}}{R_{p-air}} = Q_{p-air,i} = (1-\alpha) Q_{processor,i} \end{cases}$$

Variable α represents the percentage of heat removed by the cooling liquid, which may be determined based on the difference between the processor's temperature and the liquid temperature 411. The remaining portion of the heat is removed by air cooling, which may be determined based on the difference between the processor's temperature and the airflow temperature 412. Due to the fact of predetermined heat resistance factor R, according to one embodiment, a physical model can be defined as follows:

$$\begin{cases} R_{p-liquid} = \dfrac{C_1}{v_{pump}} \\ R_{p-air} = \dfrac{C_2}{v_{air}} \end{cases}$$

where C1 and C2 are predetermined constants. R refers to heat resistance of a processor with respect to liquid cooling or air cooling. Converting these equations into the equations above, a new constraint model can be defined as follows, also shown in FIG. 7:

$$\begin{cases} \alpha Q_{processor,i} \dfrac{C_1}{v_{pump}} + T_{liquid} = T_{processor,i} \le T_{ref} \\ (1-\alpha) Q_{processor,i} \dfrac{C_2}{v_{fan,i}} + T_{air} = T_{processor,i} \le T_{ref} \end{cases} \Rightarrow$$

$$\begin{cases} \alpha Q_{processor,i} C_1 \cdot v_{pump}^{-1} + (T_{liquid} - T_{ref}) \le 0 \\ (1-\alpha) Q_{processor,i} C_2 \cdot v_{fan,i}^{-1} + (T_{air} - T_{ref}) \le 0 \end{cases}$$

$Q_{processor}$ refers to a power generated by a processor (e.g., power=voltage*current). The above constraints indicate that the processor temperature $T_{processor}$ measured at real time must be less than the corresponding processor reference temperature $T_{ref}$ specified by the processor's specification given the liquid cooling and air cooling at any points in time, where the processor's real-time temperature $T_{processor}$ can be related to the corresponding liquid temperature $T_{liquid}$ and airflow temperature $T_{air}$.

In one embodiment, an optimization model can be derived for controller, for example, by defining a vector as the pump speed and all the fan speeds, assuming n fan speeds in total.

$$\vec{x} = \begin{pmatrix} v_{pump} \\ v_{fan,1} \\ \vdots \\ v_{fan,n} \end{pmatrix}$$

Then the objective function is defined as follows according to one embodiment:

$$f(\vec{x}) = \sum P = f_2(v_{pump}) + \sum_i f_1(v_{fan,i})$$

Optimization function $f_2$ is a pump speed optimization function and $f_1$ is a fan speed optimization function. According to one embodiment, the constraints are converted to a group of inequalities as follows, also shown in FIG. 8:

$$\vec{g}(\vec{x}) = \begin{pmatrix} g_1(\vec{x}) \\ g_2(\vec{x}) \\ g_3(\vec{x}) \\ g_4(\vec{x}) \\ g_5(\vec{x}) \\ g_6(\vec{x}) \\ \vdots \\ \vdots \\ \vdots \\ g_{3n+1}(\vec{x}) \\ g_{3n+2}(\vec{x}) \\ g_{3n+3}(\vec{x}) \end{pmatrix} = \begin{pmatrix} \alpha Q_{processor,i} C_1 \cdot v_{pump}^{-1} + (T_{liquid} - T_{ref}) \\ \underline{v}_{pump} - v_{pump} \\ v_{pump} - \overline{v}_{pump} \\ (1-\alpha) Q_{processor,1} C_2 \cdot v_{fan,1}^{-1} + (T_{air} - T_{ref}) \\ \underline{v}_{fan} - v_{fan,1} \\ v_{fan,1} - \overline{v}_{fan} \\ \vdots \\ \vdots \\ \vdots \\ (1-\alpha) Q_{processor,n} C_2 \cdot v_{fan,n}^{-1} + (T_{air} - T_{ref}) \\ \underline{v}_{fan} - v_{fan,1} \\ v_{fan,1} - \overline{v}_{fan} \end{pmatrix} \le \vec{0}^T$$

According to one embodiment, during the optimization of the pump speed and fan speeds, the above set of constraints must be satisfied, such that the total power consumption of the liquid pump and cooling fans reaches minimum as follows:

minimize: $f(\vec{x})$ subject to: $\vec{g}(\vec{x}) \le \vec{0}$

Since it is feasible to prove that the objective function f(x) is a convex function, the controller design becomes a convex optimization, and the solution is given by finding the global optimal point $\vec{x}^*$ (e.g., optimal pump speed and fan speeds). Then the $\vec{x}^*$ is the global minimizer vector of pump speed and all individual fan tray speeds. The above optimization process is periodically or constantly performed during the operations of the electronic racks. When the system starts to run, the RMC collects all data in real time, calculates the optimal controller, then outputs the control signal to pump and all fans, then moves to the next sampling cycle.

Figure 9:
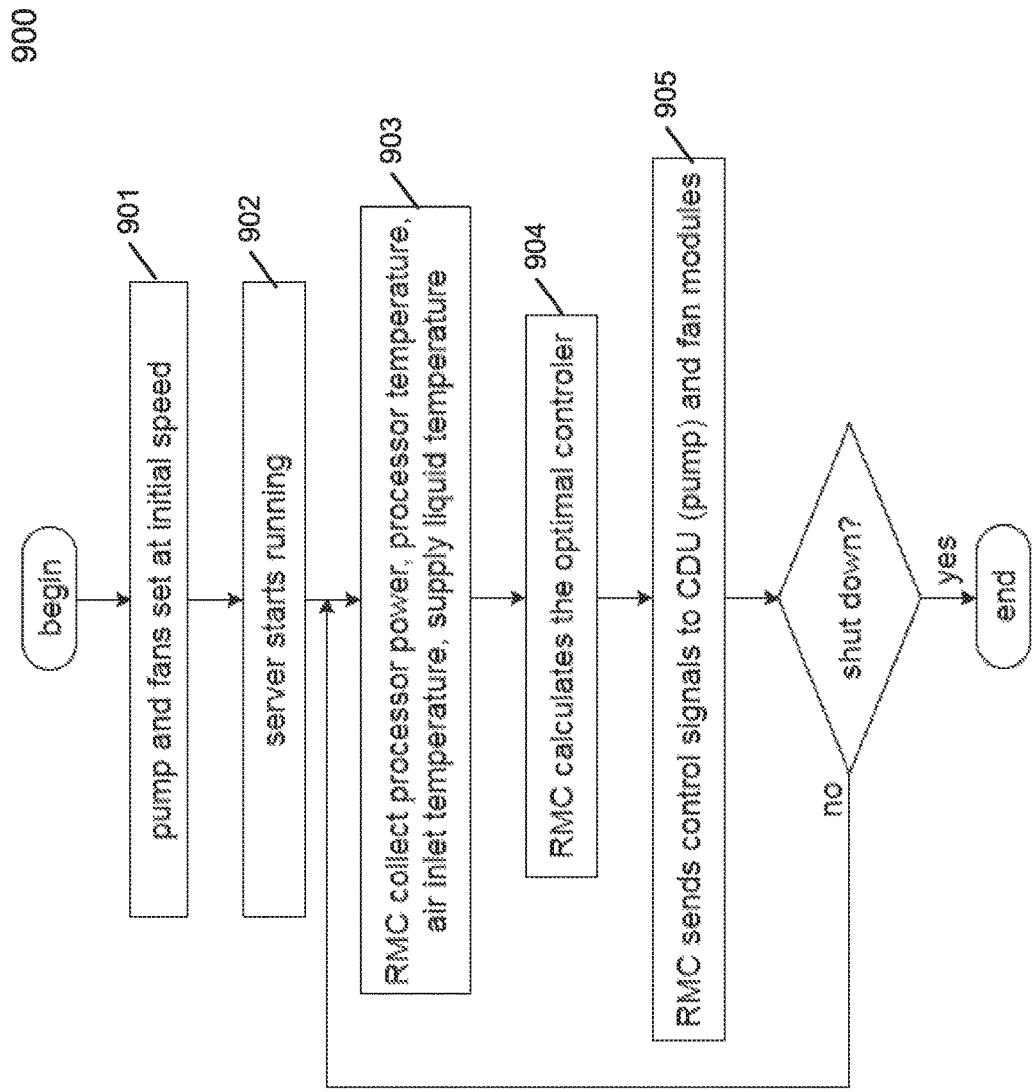
FIG. 9 is a flow diagram illustrating a process for operating an electronic rack according to one embodiment.

FIG. 9 is a flow diagram illustrating a processor of providing cooling to electronic racks according to one embodiment. Process 900 may be performed by processing logic which may include software, hardware, or a combination thereof. For example, process 900 may be performed by system 500 of FIG. 5. Referring to FIG. 9, in operation 901, the processing logic configures and sets the liquid pump and cooling fans to respective initial speeds. In operation 902, the computing nodes are started. The operations 901-902 may be concurrently performed as a part of startup of the corresponding electronic rack. In operation 903, processing logic collects the operating data from various components including processor's temperature, airflow temperature (e.g., air inlet temperature), liquid temperature (e.g., liquid supply temperature), etc. In operation 904, a speed optimization for the liquid pump and the cooling fans is performed using one or more optimization functions as described above, which generates a set of optimal speeds for the liquid pump and the cooling fans. In operation 905, the optimal speeds are utilized to configure the liquid pump and the cooling fans, such that the total power consumption reaches minimum, while a set of constraints are satisfied in view of the design specification of the liquid pump and the cooling fans. The operations 903-904 are iteratively performed until the system shuts down.

Figure 10:
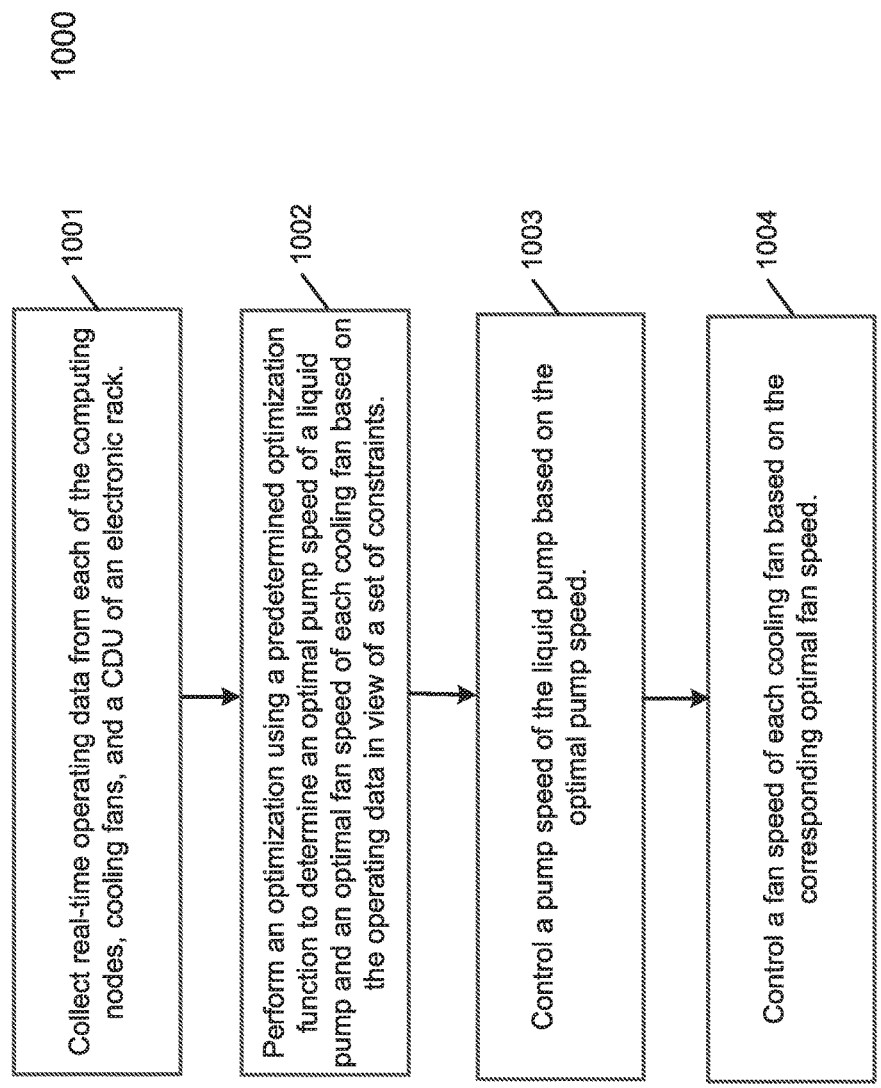
FIG. 10 is a flow diagram illustrating a process for speed optimization according to one embodiment.

FIG. 10 is a flow diagram illustrating a processor of providing cooling to electronic racks according to another embodiment. Process 1000 may be performed as a part of operations 902-903 of FIG. 9. Referring to FIG. 10, in operation 1001, processing logic collects real-time operating data from each of the computing nodes, cooling fans, and a CDU of an electronic rack. The real-time operating data includes processor temperature, liquid temperature, airflow temperature, and processor power, etc. In operation 1002, processing logic performs an optimization using a predetermined optimization function to determine an optimal pump speed and an optimal fan speed of each cooling fan or each fan module based on the real-time operating data in view of the predetermined reference data obtained from the respective pump specification and fan specification. In operation 1003, the optimal pump speed is utilized to control the subsequent speed of the liquid pump and in operation 1004, the optimal fan speeds are utilized to control the subsequent speeds of the cooling fans.

In one embodiment, the liquid cooling system is configured to remove most of the heat generated by higher power consumption components of the server (e.g., CPUs, GPUs), while the air cooling system is configured to remove heat generated by lower power consumption components that are impractical or not feasibly removed by the liquid cooling system, such as, for example, memory, storage devices, motherboard, as well as the heat radiated from the higher power consumption components. By combining a liquid cooling system and an air cooling system, the individual fans normally mounted on the server blades or the electronic racks may not be needed. However, power supply units and/or network equipment of an electronic rack may still need to be fan cooled if necessary.

Note that the cooling techniques described above can be applied to a variety of different types of data centers, such as, for example, traditional colocation data centers, brownfield data centers, and greenfield data centers. A colocation data center is a type of data center where equipment, space, and bandwidth are available for rental to retail customers. Colocation facilities provide space, power, cooling, and physical security for the server, storage, and networking equipment of other firms, and connect them to a variety of telecommunications and network service providers with a minimum of cost and complexity. A greenfield data center refers to a data center that is built and configured in a location where none exists before. The techniques described above can also be applied to or work in conjunction with a performance optimized data center (POD), or portable on-demand or container data center, where racks of servers are housed in one or more individual containers, modular rooms, or modular housings.

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack of a data center, comprising:
a plurality of computing nodes arranged in a stack, each computing node containing at least one processor attached to a liquid cold plate, wherein the liquid cold plate is coupled to a heat removal system, separate from the plurality of cooling fans, and the heat removal system cools the liquid received from the liquid cold plate;
a plurality of cooling fans, each of the cooling fans corresponding to one of the computing nodes to provide air cooling to the corresponding computing node, wherein a fan speed of each of the plurality of cooling fans is individually controllable;
a coolant distribution unit (CDU) coupled to each of the computing nodes to provide liquid cooling to a corresponding processor via a corresponding liquid cold plate, wherein the CDU includes a liquid pump to provide cooling liquid to remove heat generated from the processor of each computing node; and
a rack management controller (RMC) coupled to the CDU, the cooling fans, and the computing nodes, wherein the RMC is configured to collect real-time operating data from each of the computing nodes, the cooling fans, and the CDU, perform an optimization using a predetermined optimization function to determine an optimal pump speed of the liquid pump and determine an optimal fan speeds for each of the plurality of the cooling fans based on the collected real-time operating data, such that total power consumption of the liquid pump and the plurality of cooling fans is minimized, control a pump speed of the liquid pump based on the optimal pump speed, and control each fan speed of the plurality of cooling fans based on the optimal fan speed corresponding to each of the plurality of cooling fans, respectively.

2. The electronic rack of claim 1, wherein the optimization is performed to optimize a pump speed of the liquid pump and fan speeds of the cooling fans concurrently, such that the optimization function reaches minimum, wherein the pump speed and the fan speeds are a part of coefficients of the optimization function.

3. The electronic rack of claim 1, wherein the optimization is performed in view of a set of specifications associated with the liquid pump and cooling fans, wherein the specifications include information specifying ranges of operating parameters within which the liquid pump and the cooling fans should operate.

4. The electronic rack of claim 1, wherein the optimization function comprises:
a pump optimization function to perform a pump speed optimization on a pump speed such that a pump power consumption reaches minimum; and
a plurality of fan optimization functions, each fan speed optimization function corresponding to one of the cooling fans, wherein each fan optimization function is configured to perform a fan optimization on a fan speed of each cooling fan such that a fan power consumption of the cooling fan reaches minimum.

5. The electronic rack of claim 4, wherein the pump optimization and the fan speed optimizations are optimized concurrently, such that a total power consumption that is calculated based on the pump power consumption and the fan power consumptions reaches minimum, while a processor temperature of each processor of each computing node measured at real time is lower than a processor reference temperature associated with the processor.

6. The electronic rack of claim 4, wherein the pump speed optimization is performed such that the pump power consumption reaches minimum, while a first subset of the real-time operating data associated with the liquid pump are within respective ranges of a first set of predetermined operating reference data of the liquid pump.

7. The electronic rack of claim 6, wherein the pump speed optimization is performed, such that the pump power consumption reaches minimum, while the optimal pump speed is within a lower pump speed limit and an upper pump speed limit associated with the liquid pump.

8. The electronic rack of claim 4, wherein the fan speed optimization of each optimization function is performed for each cooling fan in the plurality of cooling fans such that a fan power consumption of the cooling fan is minimized, using a subset of the real-time operating data associated with the plurality of cooling fans, while the plurality of cooling fans are within respective ranges of a set of predetermined operating reference data of the plurality of cooling fans.

9. The electronic rack of claim 8, wherein the fan speed optimization of each cooling fan is performed, such that the fan power consumption of the cooling fan reaches minimum, while the optimal fan speed of the cooling fan is within a lower fan speed limit and an upper fan speed limit of the cooling fan.

10. A data center, comprising:
a plurality of electronic racks, wherein each of the electronic racks comprises:
a plurality of computing nodes arranged in a stack, each computing node containing at least one processor attached to a liquid cold plate, wherein the liquid cold plate is coupled to a heat removal system, separate from the plurality of cooling fans, and the heat removal system cools the liquid received from the liquid cold plate;
a plurality of cooling fans, each of the cooling fans corresponding to one of the computing nodes to provide air cooling to the corresponding computing node, wherein a fan speed of each of the plurality of cooling fans is individually controllable;
a coolant distribution unit (CDU) coupled to each of the computing nodes to provide liquid cooling to a corresponding processor via a corresponding liquid cold plate, wherein the CDU includes a liquid pump to provide cooling liquid to remove heat generated from the processor of each computing node; and
a rack management controller (RMC) coupled to the CDU, the cooling fans, and the computing nodes, wherein the RMC is configured to collect real-time operating data from each of the computing nodes, the cooling fans, and the CDU, perform an optimization using a predetermined optimization function to determine an optimal pump speed of the liquid pump and determine an optimal fan speed for each of the plurality of the cooling fans based on the collected real-time operating data, such that a total power consumption of the liquid pump and the plurality of cooling fans is minimized, control a pump speed of the liquid pump based on the optimal pump speed, and
control the fan speed of each of the plurality of cooling fans based on the optimal fan speed corresponding to each of the plurality of cooling fans, respectively.

11. The data center of claim 10, wherein the optimization is performed to optimize a pump speed of the liquid pump and fan speeds of the cooling fans concurrently, such that the optimization function reaches minimum, wherein the pump speed and the fan speeds are a part of coefficients of the optimization function.

12. The data center of claim 10, wherein the optimization is performed in view of a set of specifications associated with the liquid pump and cooling fans, wherein the specifications include information specifying ranges of operating parameters within which the liquid pump and the cooling fans should operate.

13. A method of providing a thermal management of an electronic rack of a data center, the method comprising:
collecting real-time operating data from each of a plurality of computing nodes arranged in a stack, a plurality of cooling fans, each fan having an individually controllable fan speed, and a coolant distribution unit (CDU) coupled to each of the computing nodes, each computing node containing at least one processor attached to a liquid cold plate, wherein the liquid cold plate is coupled to a heat removal system, separate from the plurality of cooling fans, and the heat removal system cools the liquid received from the liquid cold plate, wherein each of the cooling fans is associated with one of the computing nodes to provide air cooling to the corresponding computing node, wherein the CDU is configured to provide liquid cooling to a corresponding processor via a corresponding liquid cold plate, and wherein the CDU includes a liquid pump to provide cooling liquid to remove heat generated from the processor of each computing node;
performing an optimization using a predetermined optimization function to determine an optimal pump speed of the liquid pump and to determine an optimal fan speed for each of the plurality of cooling fans based on the collected real-time operating data, such that a total power consumption by the liquid pump and the plurality of cooling fans is minimized;
controlling a pump speed of the liquid pump based on the optimal pump speed; and
controlling each fan speed of the plurality of cooling fans based on the optimal fan speeds corresponding to the cooling fans respectively.

14. The method of claim 13, wherein performing an optimization comprises optimizing a pump speed of the liquid pump and fan speeds of the cooling fans concurrently, such that the optimization function reaches minimum, wherein the pump speed and the fan speeds are a part of coefficients of the optimization function.

15. The method of claim 13, wherein the optimization is performed in view of a set of specifications associated with the liquid pump and cooling fans, wherein the specifications include information specifying ranges of operating parameters within which the liquid pump and the cooling fans should operate.

16. The method of claim 13, wherein performing an optimization comprises:
performing a pump speed optimization on a pump speed using a pump optimization function such that a pump power consumption reaches minimum; and
performing a fan speed optimization on a fan speed of each of the cooling fans using a plurality of fan optimization functions, such that a fan power consumption of the cooling fan reaches minimum, wherein each fan speed optimization function corresponds to one of the cooling fans.

17. The method of claim 16, wherein the pump optimization and the fan speed optimizations are optimized concurrently, such that a total power consumption that is calculated based on the pump power consumption and the fan power consumptions reaches minimum, while a processor temperature of each processor of each computing node measured at real time is lower than a processor reference temperature associated with the processor.

18. The method of claim 16, wherein the pump speed optimization is performed such that the pump power consumption reaches minimum, while a first subset of the real-time operating data associated with the liquid pump are within respective ranges of a first set of predetermined operating reference data of the liquid pump.

19. The method of claim 18, wherein the pump speed optimization is performed, such that the pump power consumption reaches minimum, while the optimal pump speed is within a lower pump speed limit and an upper pump speed limit associated with the liquid pump.

20. The method of claim 16, wherein the fan speed optimization of each optimization function is performed for each cooling fan in the plurality of cooling fans such that a fan power consumption of the cooling fan is minimized, using a subset of the real-time operating data associated with the plurality of cooling fans, while the plurality of cooling fans are within respective ranges of a set of predetermine operating reference data of the plurality of cooling fans.

21. The method of claim 20, wherein the fan speed optimization of each cooling fan is performed, such that the fan power consumption of the cooling fan reaches minimum, while the optimal fan speed of the cooling fan is within a lower fan speed limit and an upper fan speed limit of the cooling fan.

* * * * *